US007430404B2

(12) United States Patent
Oiwa

(10) Patent No.: US 7,430,404 B2
(45) Date of Patent: Sep. 30, 2008

(54) TUNER CIRCUIT AND DIGITAL BROADCAST RECEIVER WITH THE SAME

(75) Inventor: Koji Oiwa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 499 days.

(21) Appl. No.: 11/267,317

(22) Filed: Nov. 7, 2005

(65) Prior Publication Data

US 2006/0111067 A1    May 25, 2006

(30) Foreign Application Priority Data

Nov. 24, 2004   (JP)   ............................. 2004-339118

(51) Int. Cl.
*H04B 17/02* (2006.01)
(52) U.S. Cl. .................. 455/136; 455/234.1; 455/245.1
(58) Field of Classification Search ................. 455/136, 455/138, 147, 130, 232.1, 250.1, 234.1, 245.1
See application file for complete search history.

(56) References Cited

U.S. PATENT DOCUMENTS 6,650,878 B1 * 11/2003 Abe et al. ................ 455/232.1

FOREIGN PATENT DOCUMENTS

JP     6-153100 A     5/1994

* cited by examiner

*Primary Examiner*—Tony T Nguyen
(74) *Attorney, Agent, or Firm*—Birch, Stewart, Kolasch & Birch, LLP

(57) ABSTRACT

A tuner circuit according to the invention includes two AGC control units supplying AGC voltages V1 and V2 to an AGC amplifier, respectively. When the AGC voltage V1 is higher the AGC voltage V2, a voltage on a cathode of a diode becomes high, and the diode 11 is turned off. When the AGC voltage V2 is higher than the AGC voltage V1, a voltage on an anode of the diode becomes high, and the diode 11 is tuned on. Therefore, in the case of an ordinary signal level, the AGC voltages establish a relationship of, and the AGC voltage V2 performs the control. When an excessively large disturbing signal is input, the AGC control unit controls the AGC amplifier to suppress deterioration of performance.

12 Claims, 9 Drawing Sheets

AGC VOLTAGE

AGC VOLTAGE

US 7,430,404 B2

TUNER CIRCUIT AND DIGITAL BROADCAST RECEIVER WITH THE SAME

This nonprovisional application is based on Japanese Patent Application No. 2004-339118 filed with the Japan Patent Office on Nov. 24, 2004, the entire contents of which are hereby incorporated by reference.

BACKGROUND OF THE INVENTION

1. Field of the Invention

The present invention relates to a tuner circuit for use in devices such as a television set, a video tape recorder, a set-top box and others, and also relates to a digital broadcast receiver.

2. Description of the Background Art

In recent years, terrestrial and CATV broadcasts have been moving from current analog broadcasts to digital broadcasts because the digital broadcasts can increase the number of channels, and can perform image processing of high quality. Therefore, digital broadcast receivers for receiving digital broadcasts are now in increasing demand.

FIG. 9 is a schematic block diagram of a tuner circuit in a conventional digital broadcast receiver.

In a conventional tuner circuit 200 shown in FIG. 9, a received signal received by an antenna 1 undergoes band limiting by input filter 2, and then is supplied to a variable amplifier 3 which may also be referred to as an "RF-AGC amplifier 3".

The received signal amplified by variable amplifier 3 undergoes band limiting by an interstage filter 4 (which may also be referred to as a "SAW" filter"), and is supplied to a mixer circuit 5. Antenna 1, input filter 2, variable amplifier 3 and interstage filter 4 form a receiver unit 30.

A PLL circuit 7 can change an oscillation frequency of a local oscillator 6 with a tuning voltage, and this local oscillator 6 produces a local oscillation signal interlocked with the tuning voltage. It is assumed that a digital demodulator circuit 22 controls digital PLL circuit 7.

Mixer circuit 5 mixes the local oscillation signal with the received signal to perform frequency conversion, and provides a signal to an IF amplifier 8. IF amplifier 8 amplifies the received signal, and provides it to an interstage filter 9. After band limiting is effected by interstage filter 9, the received signal is amplified by a variable amplifier 10 (which may also be referred to as an "IF-AGC amplifier 10", and is provided to a demodulator unit 20. Mixer circuit 5, local oscillator 6, PLL circuit 7, IF amplifier 8, interstage filter 9 and IF-AGC amplifier 10 form a frequency converting unit 40. Each of RF-AGC amplifier 3 and IF-AGC amplifier 10 may be collectively referred to as "AGC amplifier".

Demodulator unit 20 includes an A/D converter circuit 21 (which may be simply depicted as "A/D") converting the amplified signal amplified by IF-AGC amplifier 10 to a digital signal, a digital demodulator circuit 22 demodulating a digital modulated signal by QAM demodulation, OFDM demodulation or the like, and an error correcting circuit 23 which corrects an error caused by noises or the like. Digital demodulator circuit 22 performs conversion to provide TS (Transport Stream) signals including a picture signal, an audio signal, a data signal and others.

Internal circuits of the digital broadcast receiver converts the TS signals to the picture, audio and data signals, which can be viewed and listened to on a picture display device such as a television set.

An AGC (Auto Gain Control) operation for the received signals (including a disturbing signal) will now be described.

The AGC operation is performed to achieve automatically an optimum performance according to an intensity level of the received signal (including a disturbing signal) and more specifically to adjust a signal level. Generally, the RF-AGC amplifier for the RF signal and the IF-AGC amplifier for the IF signal are used.

This example is provided with an AGC control unit 24, which supplies AGC voltages to AGC amplifiers 3 and 10 in response to an instruction of digital demodulator circuit 22. In RF-AGC amplifier 3, a gain of the AGC amplifier is raised to prevent NF deterioration when the received signal is weak. When the received signal is strong, the gain of the AGC amplifier is lowered to adjust the AGC voltage for preventing deterioration of a distortion performance.

In IF-AGC amplifier 10, the input level of the A/D converter circuit is likewise changed according to the intensity of the received signal so that the digital signal in the optimum state is provided to the digital demodulator circuit to obtain the optimum demodulation performance.

More specifically, RF-AGC and IF-AGC amplifiers 3 and 10 are supplied with the AGC voltages corresponding to the level of the received signal provided to digital demodulator circuit 22, and thereby adjust the signal levels to improve the reception sensitivity and thus the reception performance. Although AGC control unit 24 shown in FIG. 9 is independent of digital demodulator circuit 22, AGC control unit 24 may be arranged within digital demodulator circuit 22, or may be arranged outside demodulator unit 20.

FIG. 10 illustrates filter characters of interstage filter 9.

As shown in FIG. 10, interstage filter 9 is designed to allow passing of a frequency of a digital signal included in a reception band. Therefore, the interstage filter 9 substantially removes the disturbing signal and others having frequencies outside the allowed range or band. Therefore, the degree of intensity of the disturbing signal is not taken into consideration, and digital demodulator circuit 22 of demodulator unit 20 operates to perform the AGC control using AGC control unit 24. Accordingly, when an excessive disturbing signal is input, the waveform of the received signal downstream from the AGC amplifier may be distorted so that the reception performance may deteriorate.

FIG. 11 is a schematic block diagram of another tuner circuit inside the conventional digital broadcast receiver.

Referring to FIG. 11, a tuner circuit 210 differs from tuner circuit 200 in that an AGC control unit 15 (which may be depicted merely as "AGC") controlling RF-AGC amplifier 3 is employed in addition to AGC control unit 24 controlling IF-AGC amplifier 10. Other structures are substantially the same as those in FIG. 9, and therefore detailed description thereof is not repeated.

As shown in FIG. 11, AGC control unit 15 produces and supplies the AGC voltage to RF-AGC amplifier 3.

Since tuner circuit 210 undergoes the AGC control with the signal not yet passed through interstage filter 9, the amplification level of the RF-AGC amplifier is adjusted also depending on the degree of intensity of the disturbing wave signal, and it is possible to provide the tuner circuit having the reception performance which does not deteriorate even when the disturbing signal becomes strong.

In this case, when an excessive disturbing signal is input, the gain of the AGC amplifier is lowered to suppress distortion of the received signal waveform downstream from the AGC amplifier. However, when the disturbing signal becomes larger than the received signal, the AGC control is executed to lower the gain of the AGC amplifier even when the disturbing signal has the signal level which is not considered as an excessive disturbing level, and this AGC control may cause unnecessary deterioration of the NF.

Japanese Patent Laying-Open No. 06-153100 has disclosed a structure of a tuner circuit which detects neighboring channel disturbing, and restricts the AGC voltage to prevent deterioration of the reception performance when the level of the disturbing signal is high.

However, Japanese Patent Laying-Open No. 06-153100 has merely disclosed the structure of the tuner circuit which restricts the AGC voltage when the disturbing signal is at a level of a predetermined value or more, and has not disclosed a structure which adjusts the AGC voltage according to the disturbing signal.

SUMMARY OF THE INVENTION

An object of the invention is to provide a tuner circuit which can adjust an AGC voltage according to a signal level of a disturbing signal when the signal level of the disturbing signal is excessively high, and can prevent NF deterioration when the signal level of the disturbing signal is not excessively high, and to provide a digital broadcast receiver provided with the tuner circuit.

A tuner circuit according to the invention includes a receiving unit including a level adjusting circuit adjusting a signal level of an externally transmitted RF signal according to an input control voltage; an IF signal converter circuit converting the RF signal transmitted from the receiving unit to an IF signal; and a demodulator unit receiving the signal transmitted from the IF signal converter circuit, and executing digital demodulation. The IF signal converter circuit includes a filter limiting a frequency band of the IF signal. The tuner circuit further includes an AGC control unit adjusting the control voltage based on at least one of signal levels of the IF signal provided to the filter and the IF signal provided to the demodulator unit depending on a reception situation.

Preferably, the AGC control unit includes a first voltage producing unit producing a first control voltage according to the signal level of the IF signal provided to the filter, a second voltage producing unit producing a second control voltage according to the signal level of the IF signal provided to the demodulator unit, and a voltage control unit for supplying at least of one the first and second control voltages respectively supplied from the first and second voltage producing units to the variable amplifier according to the reception situation.

Particularly, the voltage control unit includes a resistance element arranged between the second voltage producing unit and an output node of the voltage control unit, and a diode arranged parallel to the resistance element, and electrically coupled at its anode and cathode sides to the output node and the first voltage producing unit, respectively.

In particular, the voltage control unit includes a first resistance element arranged between an output node of the voltage control unit and said first voltage producing unit, and a second resistance element arranged between the second voltage producing unit and the output node of the voltage control unit, and the first resistance element has a higher resistance value than the second resistance element.

Particularly, the voltage control unit provides at least one of the first and second control voltages respectively provided from the first and second voltage producing units in response to a control instruction.

Preferably, the level adjusting circuit includes an MOS transistor receiving on its gate the control voltage and a voltage signal corresponding to the RF signal for adjusting a level of the RF signal.

Preferably, the level adjusting circuit includes a first bipolar transistor receiving on its base the control voltage and a voltage signal corresponding to the RF signal for adjusting a level of the RF signal.

Particularly, the level adjusting circuit further includes a second bipolar transistor cascade-connected to the first bipolar transistor for adjusting a level of the RF signal.

Preferably, the level adjusting circuit corresponds to an attenuator attenuating a level of the RF signal according to the control voltage.

Particularly, a difference in take-over point (cut-in level) between the first and second voltage producing units is set to 10 to 30 dB.

Preferably, at least a part of parts forming the tuner circuit are formed of one chip.

Preferably, a digital broadcast receiver includes the foregoing tuner circuit.

The tuner circuit and the digital broadcast receiver according to the invention is provided with the AGC control unit adjusting the control voltage based on at least one of the levels of the IF signal provided to the filter and the IF signal provided to the demodulator unit depending on the reception situation. Thus, the control voltage is adjusted based on the control signals upstream and downstream of the filter according to the reception situation, and the voltage thus adjusted is supplied to the variable amplifier so that it is possible to deal with the case where a disturbing signal is excessively large and to deal with the case where the disturbing signal is not excessively large.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers, and description thereof is not repeated.

Figure 1:
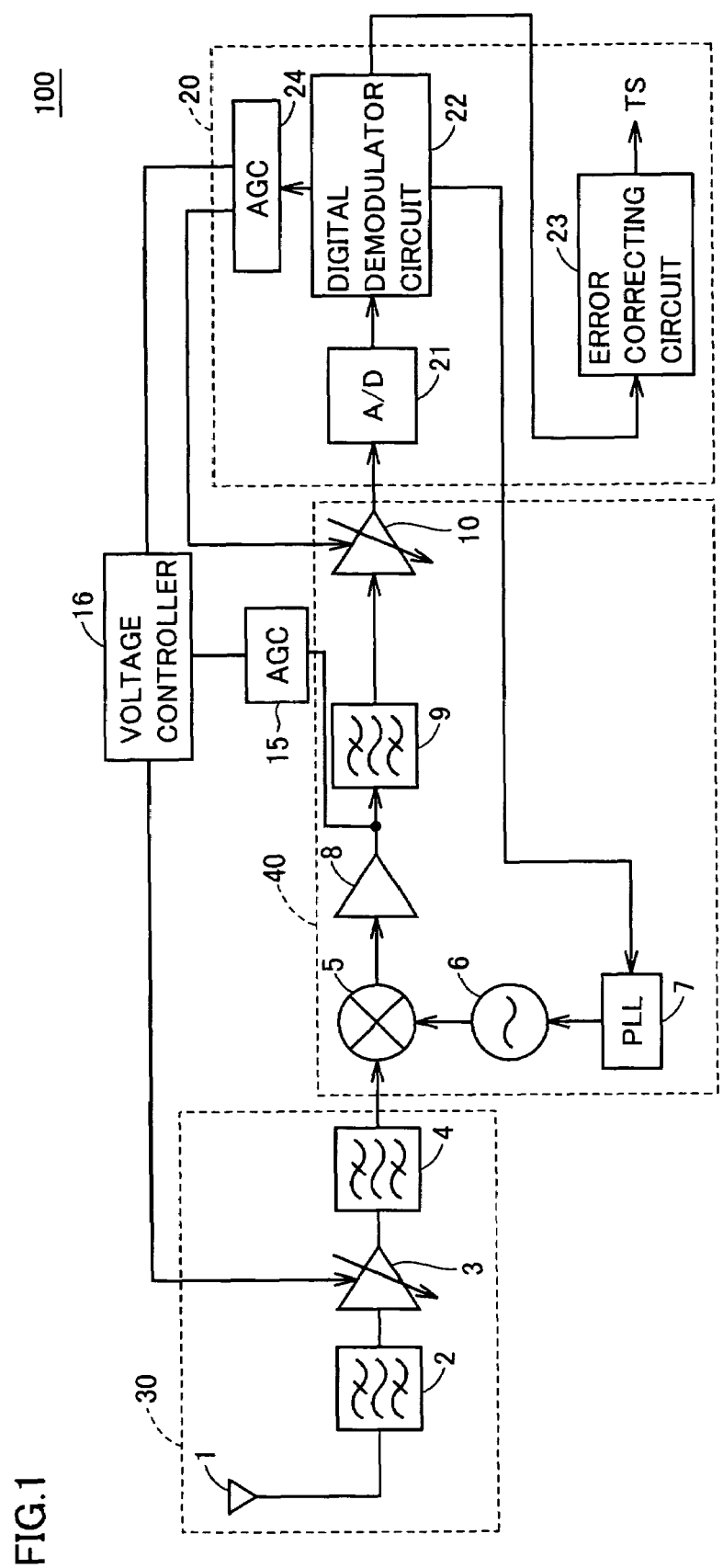
FIG. 1 is a schematic block diagram of a tuner circuit according to an embodiment of the invention.

Referring to FIG. 1, a tuner circuit 100 according to an embodiment of the invention includes a receiver unit 30 formed of an antenna 1, an input filter 2, an RF-AGC amplifier 3 and an interstage filter 4, a frequency converter unit 40 formed of a mixer circuit 5, a local oscillator 6, a PLL circuit 7, an IF amplifier 8, an interstage filter 9 and an IF-AGC amplifier 10, a demodulator unit 20, an AGC control unit 15 and a voltage control unit 16.

Tuner circuit 100 differs from tuner circuit 210 in that voltage control unit 16 is employed.

In tuner circuit 100 according to an embodiment of the invention, a received signal received by antenna 1 undergoes band limiting by input filter 2, and then is provided to RF-AGC amplifier 3.

Received signal amplified by RF-AGC amplifier 3 undergoes band limiting by interstage filter 4, and then is provided to mixer circuit 5. Mixer circuit 5 mixes a local oscillation signal with the received signal to perform frequency conversion, and provides the signal to IF amplifier 8.

IF amplifier 8 amplifies the received signal, and provides it to interstage filter 9. After undergoing band limiting by interstage filter 9, the received signal is amplified by IF-AGC amplifier 10, and is provided to demodulator unit 20.

As described above, demodulator unit 20 includes an A/D converter circuit 21 converting the amplified signal amplified by IF-AGC amplifier 10 to a digital signal, a digital demodulator circuit 22 demodulating a digital modulated signal by QAM demodulation, OFDM demodulation or the like, and an error correcting circuit 23 correcting an error caused by noises or the like. Digital demodulator circuit 22 performs the conversion to provide TS (Transport Stream) signals including a picture signal, an audio signal, data signal and others.

AGC control unit 15 provides the AGC voltage used for the AGC control to voltage control unit 16 according to the level of the received signal which is amplified by IF amplifier 8, and is provided to interstage filter 9.

As described above, an AGC control unit 24 provides the AGC voltage used for the AGC control to voltage control unit 16 according to the signal level provided from A/D converter circuit 21.

Voltage control unit 16 operates based on the AGC voltages respectively provided from AGC control units 15 and 24, and uses at least one of these AGC voltages to supply the AGC voltage to the AGC amplifier.

Figure 2:
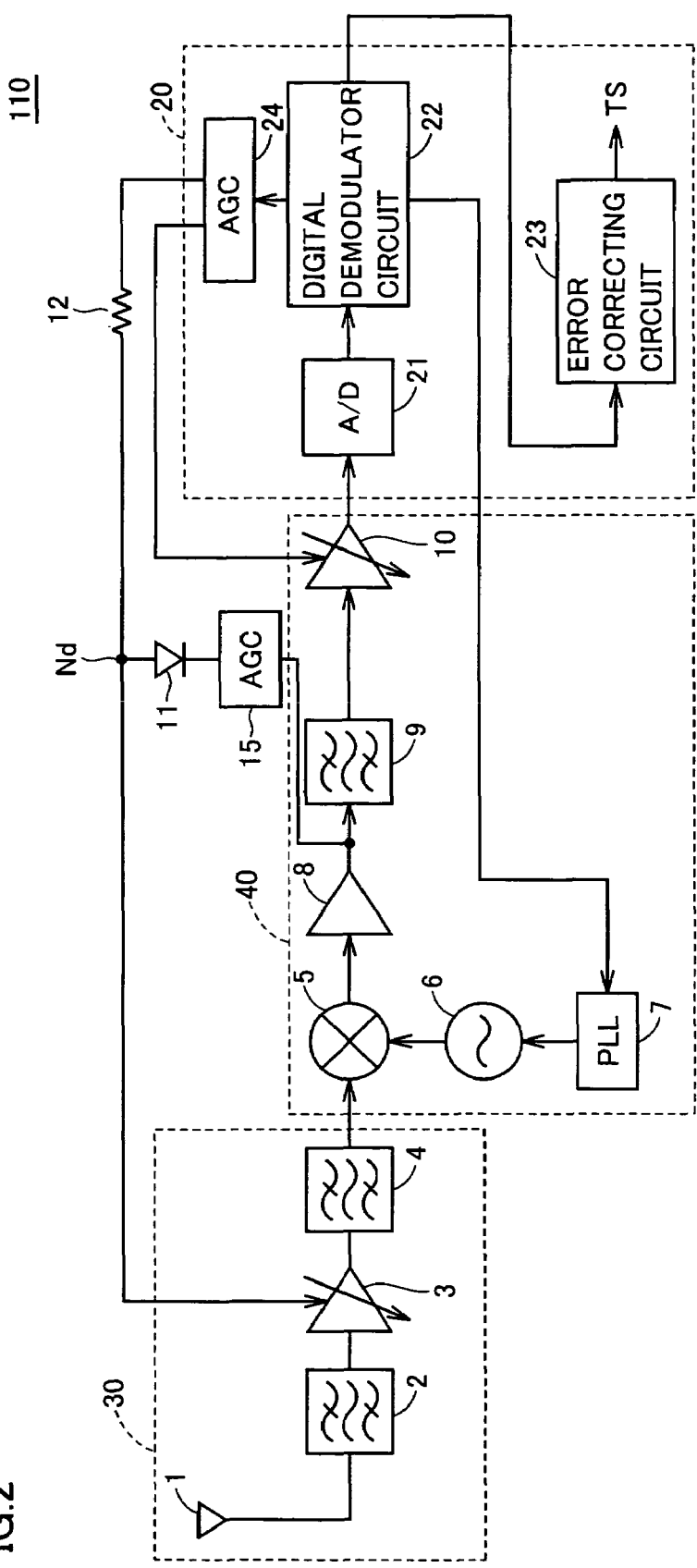
FIG. 2 shows a circuit structure illustrating a voltage control unit according to the embodiment of the invention.

Referring to FIG. 2, voltage control unit 16 according to the embodiment of the invention includes a diode 11 and a resistance 12.

Diode 11 and resistance 12 are arranged between AGC amplifier 3 and AGC control units 15 and 24, and are connected in parallel to each other. An anode side of diode 11 is electrically connected to an output node Nd of voltage control unit 16, and a cathode side thereof receives the AGC voltage from AGC control unit 15.

AGC amplifier 3 is supplied with the AGC voltage from AGC control unit 15 via diode 11. Also, AGC control unit 24 supplies the AGC voltage via resistance 12. It is assumed that AGC control units 15 and 24 produce AGC voltages V1 and V2, respectively.

When AGC voltage V1 is higher than AGC voltage V2, diode 11 carries a higher voltage on the cathode, and is turned off. Thus, diode 11 is not virtually present.

Figure 9:
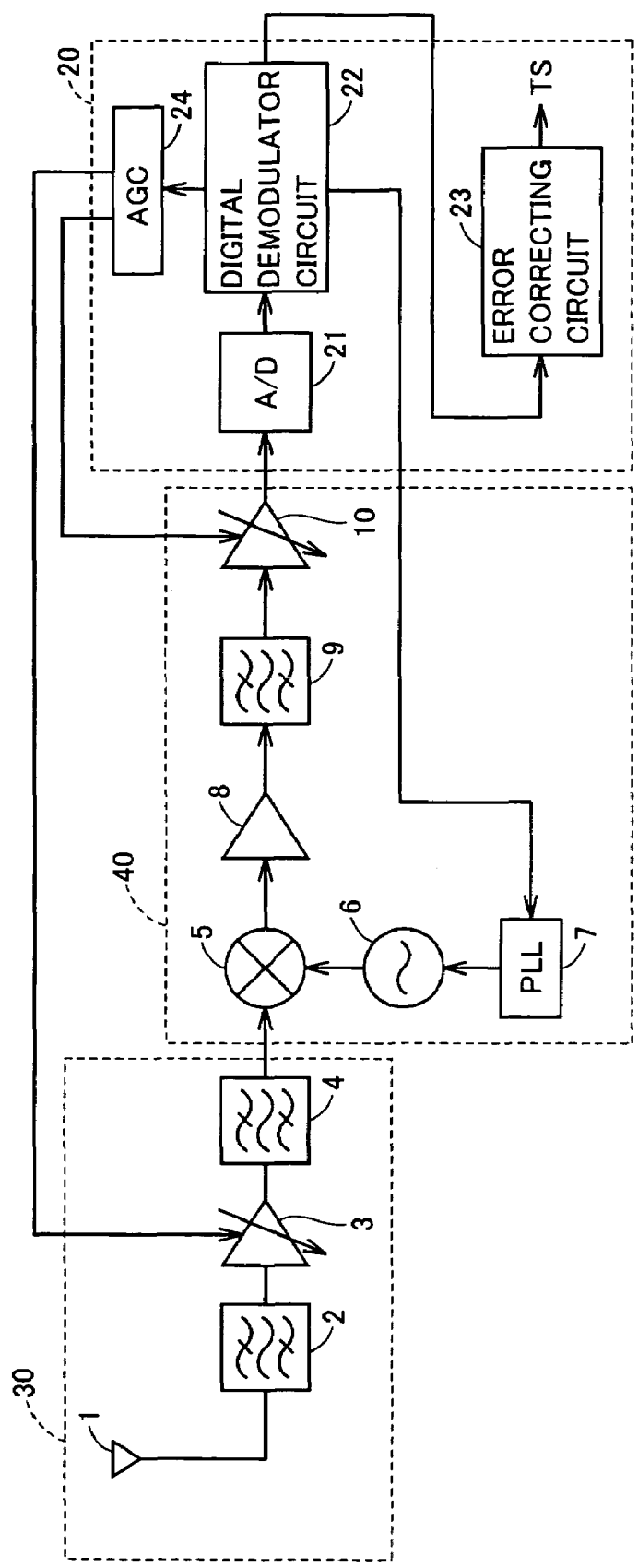
FIG. 9 is a schematic block diagram of a tuner circuit in a conventional digital broadcast receiver.
Figure 10:
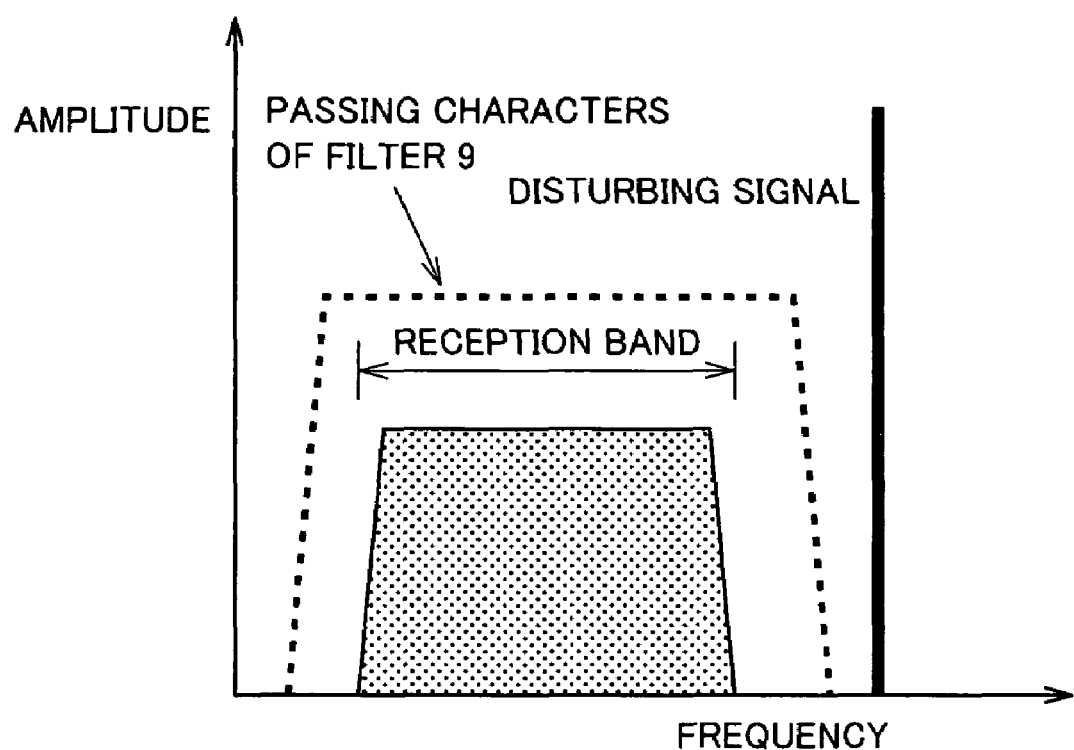
FIG. 10 illustrates filter characters of an interstage filter.

Accordingly, when it is assumed that diode 11 is not present, a current does not flow through a terminal supplied with the AGC voltage of AGC amplifier 3 so that resistance 12 hardly causes a voltage drop, and control voltage V2 controls the AGC amplifier 3. Thus, AGC amplifier 3 is controlled in the substantially same state as that already described with reference to FIG. 9.

Figure 11:
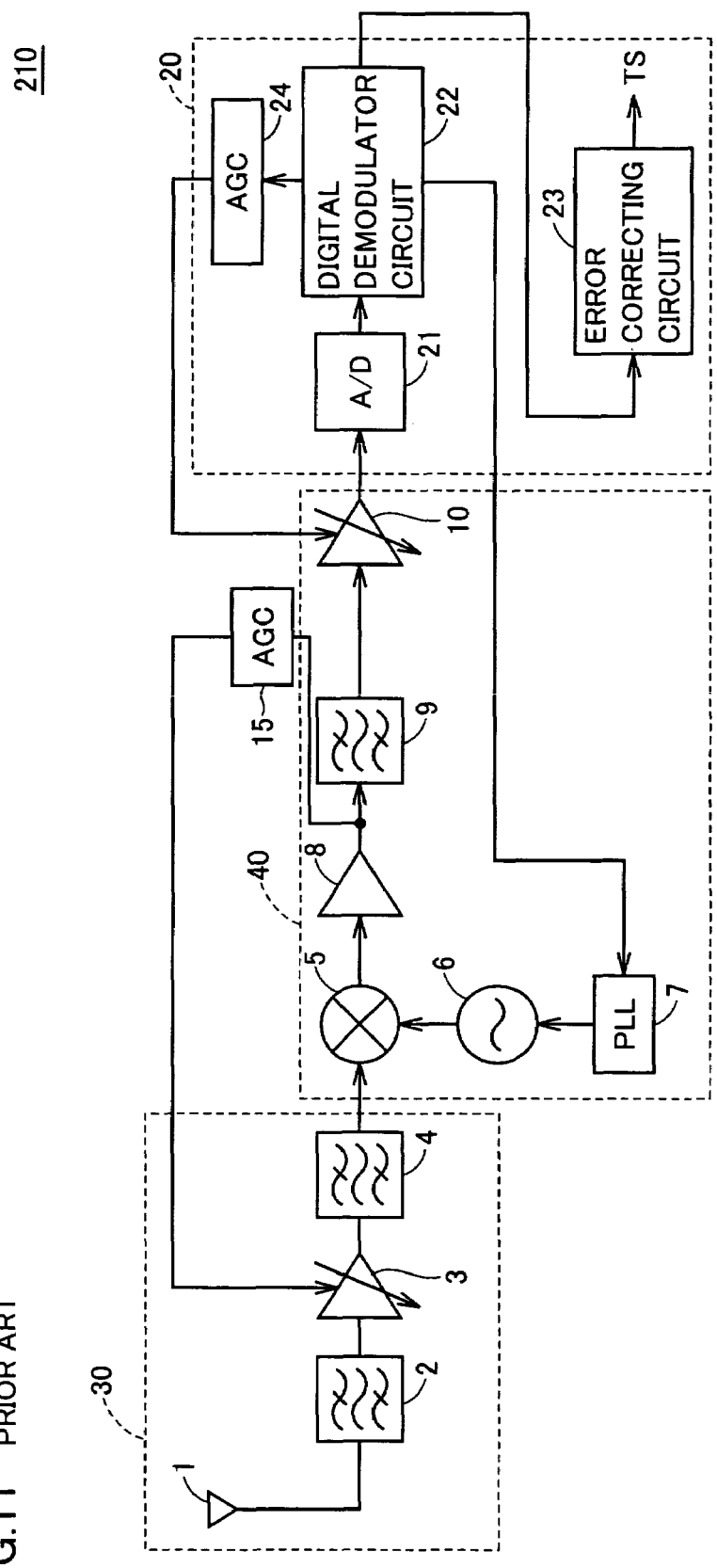
FIG. 11 is a schematic block diagram of another tuner circuit in the conventional digital broadcast receiver.

When AGC voltage V2 is higher than AGC voltage V1, diode 11 carries a higher voltage on the anode, and is turned on. Thus, diode 11 can be considered as a small resistance. Assuming that diode 11 is a small resistance, AGC voltage V2 is pulled into AGC voltage V1 to form a composite voltage of AGC voltages V1 and V2, and the value of the small resistance approaches 0 ohms as AGC voltage V2 exceeds AGC voltage V1 by a larger value. Therefore, the control with AGC voltage V2 is not performed, but the control with AGC voltage V1 is performed. Thus, when AGC voltage V1 becomes low, the resistance component of diode 11 becomes sufficiently smaller than that of resistance 12, which equivalently achieves a state that resistance 12 is not present. This state is equivalent to the circuit shown in FIG. 11.

When an excessive signal, which may cause a problem, is input, i.e., when an excessive disturbing signal is input, AGC control unit 15 sets AGC voltage to a lower level for suppressing amplification of AGC amplifier 3. As described above, therefore, AGC voltages V1 and V2 exhibit a relationship of (V1<V2), and the control with AGC voltage V1 is performed. Therefore, when an excessive disturbing signal is input, AGC control unit 15 controls AGC amplifier 3, and deterioration of the performance can be suppressed. When the signals are at ordinary levels, a relationship of (V1≧V2) is achieved, and the control with AGC voltage V2 is performed. Therefore, when the disturbing signal is at a level substantially causing no problem, the control with control voltage V1 is not performed, which can prevent a problem of wasteful deterioration of the NF.

According to the above description, diode 11 is interposed such that the cathode is electrically coupled to output node Nd. However, the polarity of the diode must be inverted if the variable amplifier has such reverse characters that the gain lowers with rising of the AGC voltage.

Figure 3:
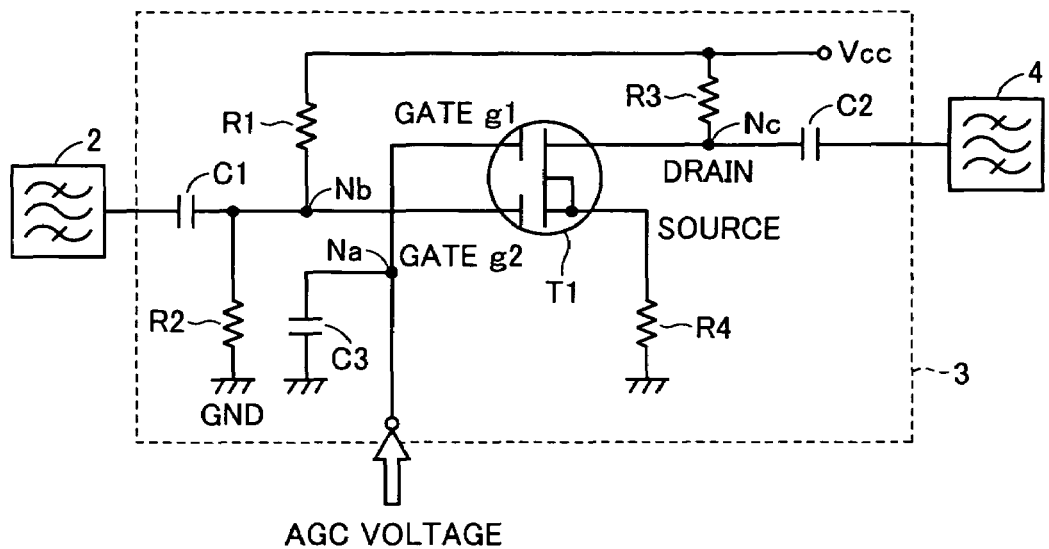
FIGS. 3-5 show circuit structures of RF-AGC amplifiers according to the embodiment of the invention, respectively.

Referring to FIG. 3, RF-AGC amplifier 3 according to the embodiment of the invention includes capacitors C1-C3, resistances R1-R4 and a Field-Effect Transistor (FET) T1.

Capacitor C1 is arranged between a node Nb and input filter 2. Resistance R1 is arranged between a power supply voltage Vcc and node Nb. Resistance R2 is arranged between node Nb and a ground voltage GND. Node Nb is electrically coupled to a gate g2 of transistor T1. A node Na is supplied with the AGC voltage. Capacitor C3 is arranged between ground voltage GND and node Na. Node Na is electrically coupled to a gate g1 of transistor T1. Resistance R4 is arranged between a source of transistor T1 and ground voltage GND. Transistor T1 has a drain electrically coupled to node Na. Resistance R3 is arranged between power supply voltage Vcc and node Na. Capacitor C2 is arranged between interstage filter 4 and node Na.

A voltage level of the received signal passed through input filter 2 is provided to gate g1 owing to capacity coupling of capacitor C1. Other gate g2 is supplied with the AGC voltage, and thereby transistor T1 is turned on so that the voltage level of a node Nc of transistor T1 is amplified based on the AGC voltage and the received signal, and the voltage at the level thus amplified is provided to the interstage filter 4 owing to the capacity coupling of capacitor C2.

The gate terminal of the FET has a large forward resistance component, and a current hardly flows therethrough. In the RF-AGC amplifier 3 of the above structure, the terminal receiving the AGC voltage is electrically coupled to the gate terminal of the FET so that the AGC voltage is input without causing voltage drop by resistance 12.

Figure 4:
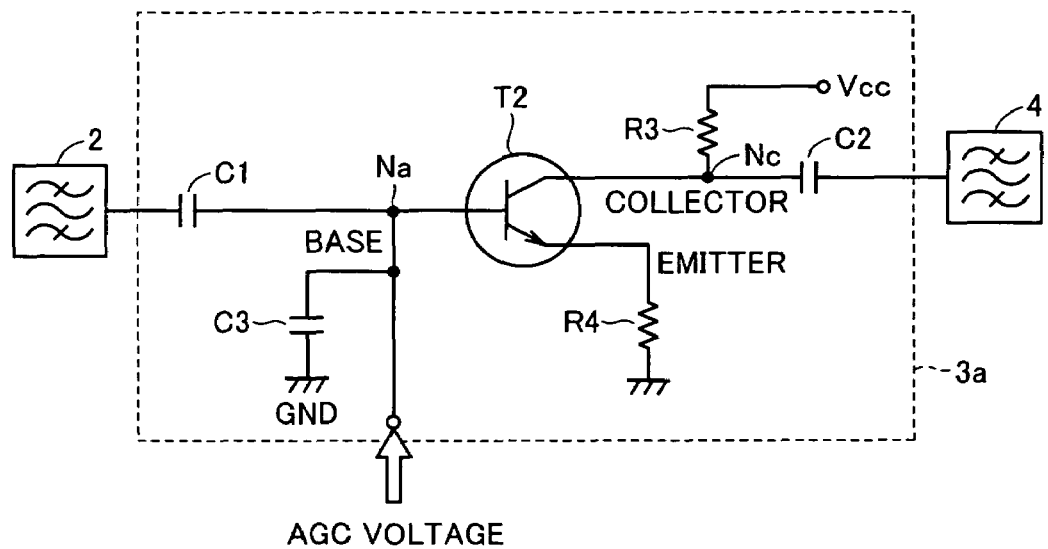

Referring to FIG. 4, an RF-AGC amplifier 3a according to the embodiment of the invention includes capacitors C1-C3, resistances R3 and R4, and a transistor T2. Transistor T2 is a bipolar transistor.

The base of transistor T2 is electrically coupled to node Na. The collector is electrically coupled to node Nc. The emitter is electrically coupled to ground voltage GND via a resistance R4. Capacitor C1 is arranged between input filter 2 and node Na. Capacitors C2 and C3 as well as resistance R3 are substantially the same as those of RF-AGC amplifier 3 in FIG. 3 already described, and therefore detailed description thereof is not repeated.

When a voltage is applied between the collector and emitter of transistor T2, it amplifies the signal provided to its base, and provides the amplified signal to the collector. In this operation, the AGC voltage applied to the base adjusts the output level.

A current hardly flows through the base terminal of transistor T2 although a current larger than that flowing through the gate terminal of the FET flows through the gate terminal. Therefore, the terminal supplied with the AGC voltage of the AGC amplifier is electrically coupled to the base terminal of transistor T2 so that it can be supplied with the AGC voltage without causing substantially no voltage drop due to resistance 12.

Since PNP and NPN transistors are less expensive than FETs, the above structure can reduce a cost.

Figure 5:
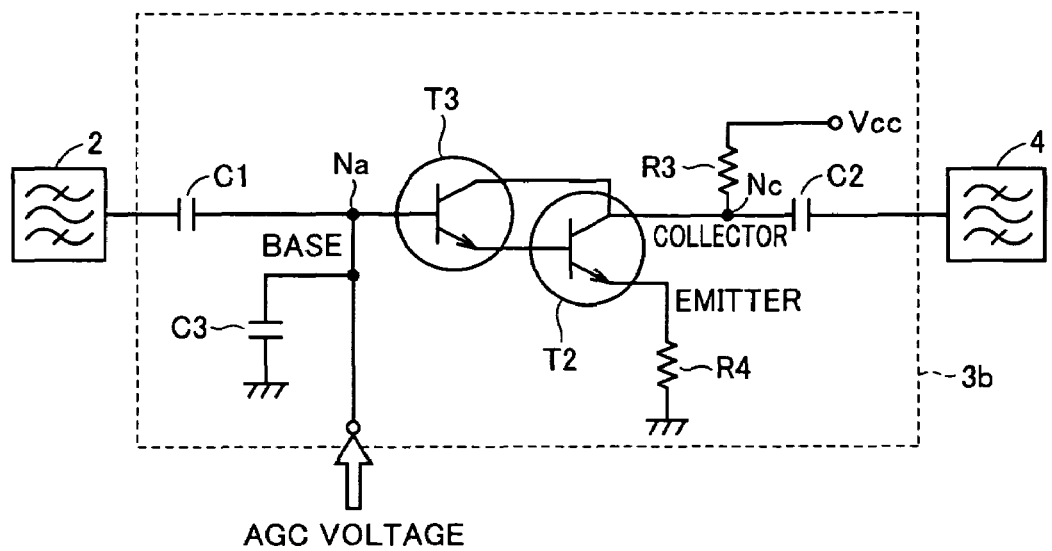

Referring to FIG. 5, an RF-AGC amplifier 3b according to the embodiment of the invention differs from RF-AGC amplifier 3a in that a transistor T3 is further employed. Transistor T3 is cascade-connected to transistor T2, and has a base electrically coupled to node Na. Transistor T3 has an emitter connected to the base of transistor T2 and a collector electrically coupled to node Nc.

In this embodiment, since the AGC voltage is likewise applied to the base of transistor T2, the AGC voltage controls the output level of the collector. The cascade connection can increase the amplification factor so that the base current can be smaller than that in the structure employing only one transistor.

By employing the above structure, the terminal, which receives the AGC voltage supplied to the AGC amplifier, is electrically coupled to the base terminal of the cascade-connected transistor, and this can substantially or nearly suppress the voltage drop due to resistance 12.

As described above, the PNP and NPN transistors are less expensive than the FETs, and therefore can reduce the cost.

Figure 6:
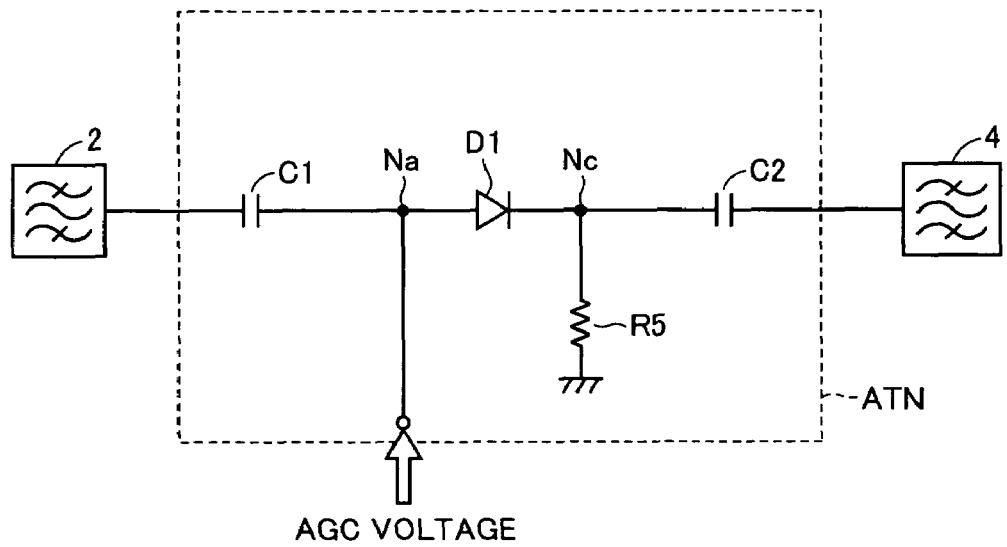
FIG. 6 shows a circuit structure of a variable attenuator according to the embodiment of the invention.

Referring to FIG. 6, a variable attenuator ATN according to the embodiment of the invention includes capacitors C1 and C2, a diode D1 and a resistance R5. Diode D1 has an anode electrically coupled to node Na and a cathode electrically coupled to node Nc. Other connection relationships of the components and elements are substantially the same as those already described, and therefore detailed description thereof is not repeated.

Diode D1 is a PIN diode having a resistance of which value changes according to a current flowing therethrough. When a current flows through diode D1, the resistance value lowers to allow passing of the signal. When a current does not flow, the resistance value of diode D1 rises to attenuate the signal. In this state, the signal level can be adjusted by applying the AGC voltage to the anode of diode D1.

Variable attenuator ATN described above has characters that it attenuates the received signal according to the AGC voltage. Thus, variable attenuator ATN does not perform amplification, but is resistant to distortion so that it can improve the disturbing characters.

Therefore, this variable attenuator ATN can be used instead of the AGC amplifier. Alternatively, this variable attenuator may be used together with a stationary amplifier so that the disturbing characters can be improved while suppressing the NF deterioration.

Figure 7:
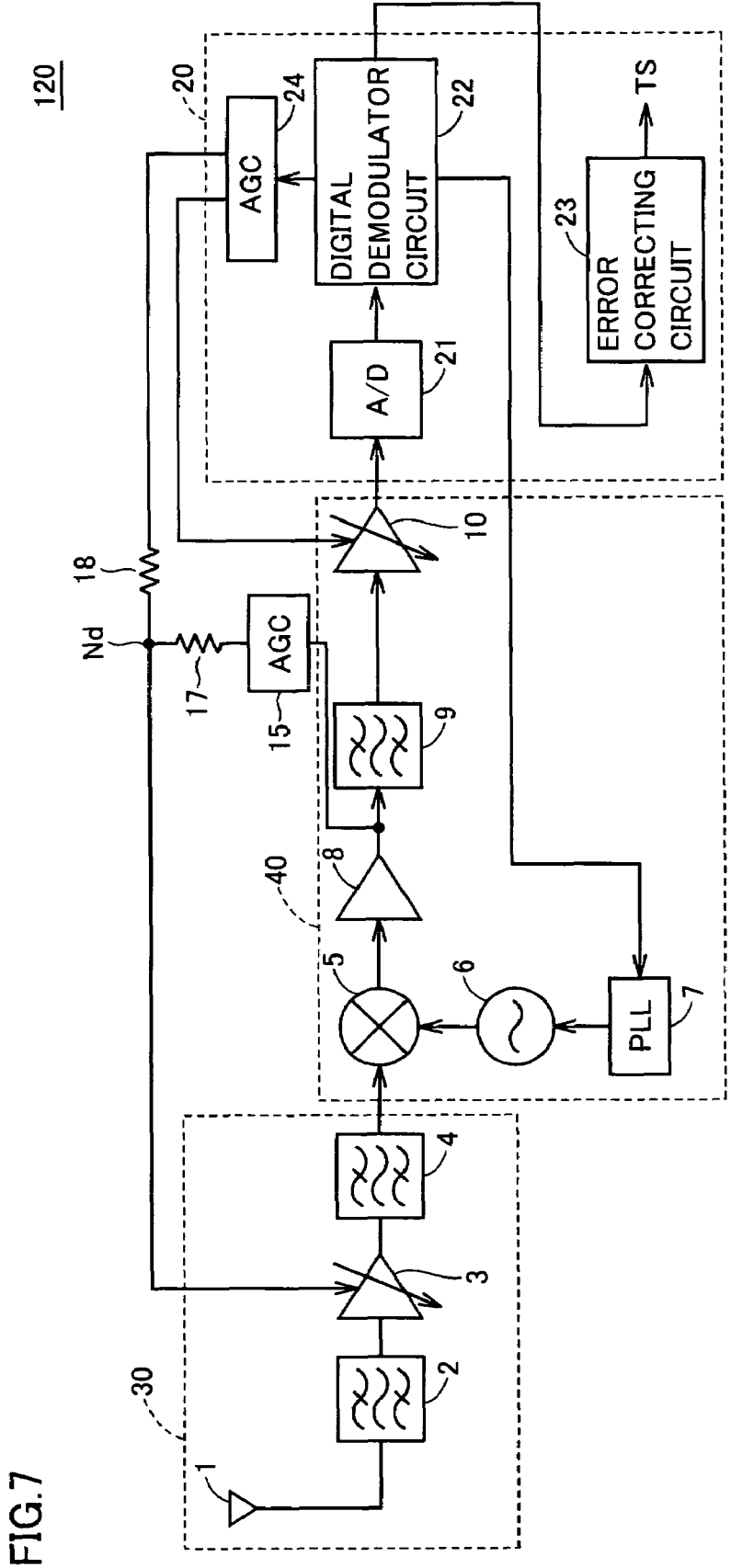
FIG. 7 is a schematic block diagram of the tuner circuit according to a modification of the embodiment of the invention.

Referring to FIG. 7, a tuner circuit 120 according to a first modification of the embodiment of the invention differs from tuner circuit 110 in that diode 111 and resistance element 12 are replaced with resistance elements 17 and 18, respectively. Structures other than the above are the same as those already described, and therefore detailed description thereof is not repeated.

Resistance element 17 has a sufficiently larger resistance value than resistance element 18. In the normal operation of this structure, therefore, AGC voltage V2 is less susceptible to AGC voltage V1 owing to resistance element 17a sufficiently larger resistance value than resistance element 18, and AGC voltage V2 is supplied to AGC amplifier 3.

When an excessive signal is input, AGC voltage V1 changes to a large extent so that the voltage level of output node Nd lowers even when AGC voltage V2 does not change, and the adjustment can be performed to prevent saturation of the gain of AGC amplifier 3.

Figure 8:
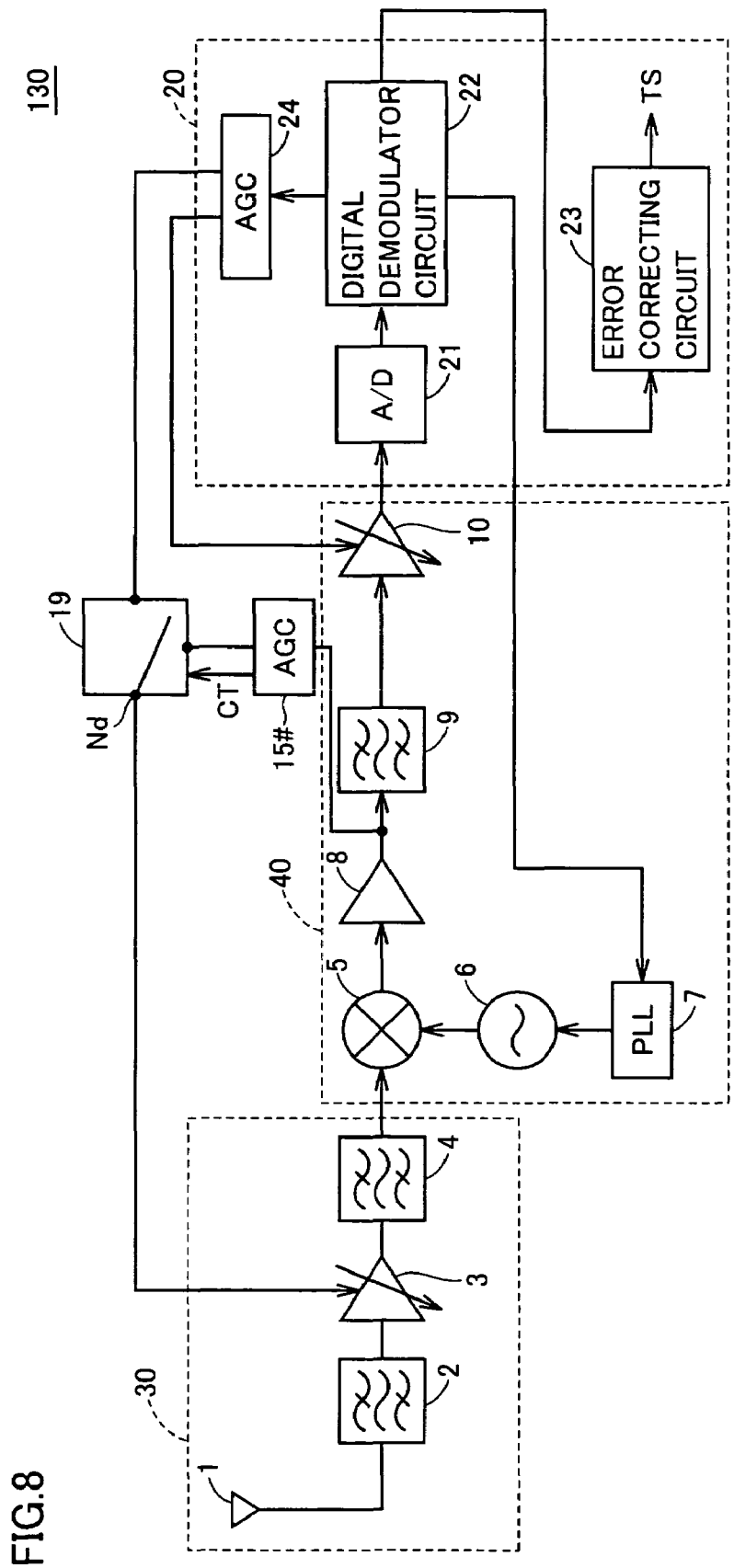
FIG. 8 is a schematic block diagram of a tuner circuit according to a second modification of the embodiment of the invention.

Referring to FIG. 8, a tuner circuit 130 according to a second modification of the embodiment of the invention differs from tuner circuit 120 in that resistance elements 17 and 18 are eliminated, a switch 19 is newly employed and AGC control unit 15 is replaced with a control unit 15#. Structures other than the above are substantially the same as those in FIG. 2, and therefore detailed description thereof is not repeated.

Switch 19 operates based on a control signal CT provided from AGC control unit 15#.

AGC control unit 15# has a signal producing circuit producing control signal CT although not shown. More specifically, it is determined whether the signal level of the IF signal is at or higher than a predetermined threshold voltage or not. When it is higher than the predetermined voltage, control signal CT is set, e.g., to an "H" or "L" level. In response to control signal CT, switch 19 changes its connection relationship. More specifically, it electrically couples, e.g., AGC control unit 24 to AGC amplifier 3 in response to control signal CT at the "L" level. Also, it connects AGC control unit 15# to AGC amplifier 3 in response to control signal CT at the "H" level.

The above structure can switch or change the AGC voltage, and therefore can perform precise control. When an excessive disturbing signal, which may cause a problem, is input, control signal CT attains, e.g., at the "H" level, and AGC voltage V1 controls AGC amplifier 3. In the normal state, control signal CT attains the "L" level, and AGC voltage V2 controls AGC amplifier 3. The setting of the above threshold voltage depends on the operation polarity of the AGC amplifier, variable attenuator or the like.

A take-over point set in a digital broadcast receiver is usually 50 to 60 dB. This is because distortion of circuits of and downstream from the AGC amplifier starts nearly at the above level. The take-over point (cut-in level) is a start signal level at which the AGC voltage starts the operation. In the case where the take-over point is 70 dB, the AGC control does not operate when the input level is equal to or lower than 70 dB, and the variable amplifier and variable attenuator attain the maximum gains.

However, when the input level is higher than 70 dB, the AGC control operates to keep a constant output level. More specifically, when a signal of 80 dB is input, the gain of the variable amplifier lowers by 10 dB which is a difference between 80 dB the take-over point of 70 dB.

It is assumed that the take-over point of AGC control unit 24 is set to 50-60 dB in the normal operation. The disturbing signal may not be within a reception band, but may be outside the reception band, and it is impossible to deal with the disturbing signal at an excessively large input level.

Accordingly, it is preferable to the take-over point set in the AGC control unit 15# is higher than the above level. For example, it is preferable to set the take-over point to 70-80 dB which is higher by a value nearly between a minimum value of 10 dB and a maximum value of 30 dB.

According to the above manner, AGC control unit 15# is set to have the take-over point higher than that of AGC control unit 24 so that the AGC control unit 15 does not effect the AGC control on an unexcessive disturbing signal, and the AGC control can be efficiently executed by using the two AGC control units to achieve the optimum operation of the tuner circuit.

A part or the whole of the above circuit structure may be formed of a single IC to simplify the circuit structure and to improve the performance. This can also reduce the size and power consumption.

A part or the whole of the above circuit structure may be arranged inside a single casing to simplify the circuit structure and to improve the performance. This can likewise reduce the size and power consumption.

By arranging the tuner circuit according to the embodiment in a single casing, it is possible to improve the general versatility and to reduce a design time required for designing the digital broadcast receiver. Naturally, this tuner circuit may be mounted on the digital broadcast receiver, and a part or the whole of component parts of the tuner circuit may be mounted on a single IC. This structure can reduce a footprint of the circuits, and can also reduce the size and power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner circuit comprising:
a receiving unit including a level adjusting circuit adjusting a signal level of an externally transmitted RF signal according to an input control voltage;
an IF signal converter circuit converting the RF signal transmitted from said receiving unit to an IF signal;
a demodulator unit receiving the signal transmitted from the IF signal converter circuit, and executing digital demodulation,
said IF signal converter circuit including a filter limiting a frequency band of said IF signal; and
an AGC control unit adjusting said control voltage based on at least one of signal levels of the IF signal provided to said filter and the IF signal provided to said demodulator unit depending on a reception situation.

2. The tuner circuit according to claim 1, wherein
said AGC control unit includes:
a first voltage producing unit producing a first control voltage according to the signal level of the IF signal provided to said filter,
a second voltage producing unit producing a second control voltage according to the signal level of the IF signal provided to said demodulator unit, and
a voltage control unit for supplying at least of one the first and second control voltages respectively supplied from said first and second voltage producing units to said variable amplifier according to said reception situation.

3. The tuner circuit according to claim 2, wherein
said voltage control unit includes:
a resistance element arranged between said second voltage producing unit and an output node of said voltage control unit, and
a diode arranged parallel to said resistance element, and electrically coupled at its anode and cathode sides to said output node and said first voltage producing unit, respectively.

4. The tuner circuit according to claim 2, wherein
said voltage control unit includes:
a first resistance element arranged between an output node of said voltage control unit and said first voltage producing unit, and
a second resistance element arranged between the output node of said voltage control unit and said second voltage producing unit; and
said first resistance element has a higher resistance value than the second resistance element.

5. The tuner circuit according to claim 2, wherein
said voltage control unit provides at least one of said first and second control voltages respectively provided from said first and second voltage producing units in response to a control instruction.

6. The tuner circuit according to claim 2, wherein
a difference in take-over point (cut-in level) between said first and second voltage producing units is set to 10 to 30 dB.

7. The tuner circuit according to claim 1, wherein
said level adjusting circuit includes an MOS transistor receiving on its gate said control voltage and a voltage signal corresponding to said RF signal for adjusting a level of said RF signal.

8. The tuner circuit according to claim 1, wherein
said level adjusting circuit includes a first bipolar transistor receiving on its base said control voltage and a voltage signal corresponding to said RF signal for adjusting a level of said RF signal.

9. The tuner circuit according to claim 8, wherein
said level adjusting circuit further includes a second bipolar transistor cascade-connected to said first bipolar transistor for adjusting a level of said RF signal.

10. The tuner circuit according to claim 1, wherein
said level adjusting circuit corresponds to an attenuator attenuating a level of said RF signal according to said control voltage.

11. The tuner circuit according to claim 1, wherein
at least a part of parts forming said tuner circuit are formed of one chip.

12. A digital broadcast receiver comprising:
a tuner circuit, wherein
said tuner circuit includes:
a receiving unit including a level adjusting circuit adjusting a signal level of an externally transmitted RF signal according to an input control voltage,
an IF signal converter circuit converting the RF signal transmitted from said receiving unit to an IF signal,
a demodulator unit receiving the signal transmitted from the IF signal converter circuit, and executing digital demodulation,
said IF signal converter circuit having a filter limiting a frequency band of said IF signal, and
an AGC control unit adjusting said control voltage based on at least one of signal levels of the IF signal provided to said filter and the IF signal provided to said demodulator unit depending on a reception situation.

* * * * *